United States Patent
Ghyselen

(10) Patent No.: US 10,453,739 B2
(45) Date of Patent: Oct. 22, 2019

(54) METHOD FOR TRANSFERRING MONOCRYSTALLINE PADS

(71) Applicant: Soitec, Bernin (FR)

(72) Inventor: Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/759,457

(22) PCT Filed: Sep. 19, 2016

(86) PCT No.: PCT/FR2016/052363
§ 371 (c)(1),
(2) Date: Mar. 12, 2018

(87) PCT Pub. No.: WO2017/046548
PCT Pub. Date: Mar. 23, 2017

(65) Prior Publication Data
US 2018/0182661 A1    Jun. 28, 2018

(30) Foreign Application Priority Data
Sep. 18, 2015 (FR) .................. 15 58810

(51) Int. Cl.
| | |
|---|---|
| *H01L 21/762* | (2006.01) |
| *C30B 25/18* | (2006.01) |
| *C30B 33/06* | (2006.01) |
| *H01S 5/02* | (2006.01) |

(52) U.S. Cl.
CPC ...... *H01L 21/76254* (2013.01); *C30B 25/186* (2013.01); *C30B 33/06* (2013.01); *H01S 5/0215* (2013.01)

(58) Field of Classification Search
CPC ............ H01L 21/76254; H01S 5/0215; C30B 25/186; C30B 33/06
See application file for complete search history.

(56) References Cited

U.S. PATENT DOCUMENTS

| | | |
|---|---|---|
| 5,374,564 A | 12/1994 | Bruel |
| 5,854,123 A | 12/1998 | Sato et al. |
| (Continued) | | |

OTHER PUBLICATIONS

Alexe et al., Wafer bonding: applications and technology, Springer series in materials science, ISSN 0933-033X; (2004), vol. 75 (5 part document).

(Continued)

*Primary Examiner* — Karen Kusumakar
(74) *Attorney, Agent, or Firm* — TraskBritt

(57) ABSTRACT

A method of transferring blocks of semiconductor material to a substrate comprises the following steps: a. providing an intermediate substrate, the intermediate substrate comprising, on one of its faces, blocks, the blocks comprise a monocrystalline material, the blocks comprising an embrittlement area delimiting a block portion intended to be transferred onto a final substrate; b. executing an assembling step by putting a free surface of each of the blocks in contact with the final substrate; and c. executing, after the assembling step, detachment at the embrittlement area of each of the blocks. During the assembling step, the intermediate substrate deforms so that the free surfaces of the blocks become coplanar.

20 Claims, 2 Drawing Sheets

(56) References Cited

U.S. PATENT DOCUMENTS

| | | | | |
|---|---|---|---|---|
| 6,562,127 B1* | 5/2003 | Kud | ................. | C30B 33/06 |
| | | | | 117/915 |
| 2005/0003650 A1* | 1/2005 | Ramanathan | ........... | H01L 24/11 |
| | | | | 438/614 |
| 2010/0207212 A1 | 8/2010 | Takei et al. | | |
| 2011/0244613 A1* | 10/2011 | Heck | ................. | B82Y 20/00 |
| | | | | 438/34 |

OTHER PUBLICATIONS

International Written Opinion for International Application No. PCT/FR2016/052363 dated Dec. 12, 2016, 11 pages with translation.
International Search Report for International Application No. PCT/FR2016/052363 dated Dec. 12, 2016, 2 pages.

\* cited by examiner

METHOD FOR TRANSFERRING MONOCRYSTALLINE PADS

CROSS-REFERENCE TO RELATED APPLICATIONS

This application is a national phase entry under 35 U.S.C. § 371 of International Patent Application PCT/FR2016/052363, filed Sep. 19, 2016, designating the United States of America and published in English as International Patent Publication WO 2017/046548 A1 on Mar. 23, 2017, which claims the benefit under Article 8 of the Patent Cooperation Treaty to French Patent Application Serial No. 1558810, filed Sep. 18, 2015.

TECHNICAL FIELD

The application relates to an adapted transfer method for reconstructing a substrate as an array of monocrystalline blocks on the surface of a final substrate.

The application also relates to a stack obtained by the transfer method.

BACKGROUND

A transfer method known from the state of the art, described in U.S. Pat. No. 6,562,127 B1 and shown in FIG. 1 comprises the steps:
  a. providing an intermediate substrate 1, the intermediate substrate 1 comprising, on one of its faces, blocks 2 assembled according to a first main face 3 to the intermediate substrate 1, the blocks 2 having a free surface 4 opposite to the first main face 3, and comprising a monocrystalline material, the blocks 2 comprising an embrittlement area 5, the embrittlement area 5 and the free surface 4 of each block 2 delimiting a block portion 7 intended to be transferred onto a final substrate 6;
  b. executing an assembling step by putting the free surface 4 of each of the blocks 2 in contact with the final substrate 6; and
  c. executing detachment at the embrittlement area 5 of each of the blocks 2 so as to transfer the block portion 7 of each of the blocks 2 onto the final substrate 6.

By "block" is meant an entity comprising two substantially parallel main faces, both parallel faces of block 2 being connected through a lateral surface. Both main faces of the block 2 may have any possible shapes, including regular shapes and irregular shapes.

At the end of the transfer method, the block portions 7 are transferred onto the final substrate 6 as illustrated in FIG. 2.

The surface of the final substrate 6 is thus covered with block portions 7 on which devices for microelectronics, photonics, optronics, and photovoltaics may be fabricated.

The blocks 2 may comprise parallel faces with a square, rectangular, hexagonal, polygonal, or circular shape, for example, and may be positioned regularly, for example, as a grid or array, on the intermediate substrate 1. Therefore, the block portions 7 may also be positioned regularly on the final substrate 6.

This transfer method is of particular interest when the material making up the blocks 2 can only be formed as substrates with an insufficient size (small diameter) with respect to the considered industrial application.

Notably, indium phosphide (InP) substrates are only presently available as a substrate with a diameter of 100 mm. The use of such InP substrates in existing production lines of circuits on a 200 mm substrate is simply impossible.

Depending on the relevant material, and with respect to the maturity of the market for the corresponding material, the limiting size changes over time. For example, for silicon, it is currently at 300 mm.

The list of materials of interest for resorting to such a method notably comprises: SiC, GaN, InP, GaSb, GaP, InAs, Ge, ZnO, $LiTaO_3$, $LiNbO_3$, diamond, sapphire, MgO, $CeO_2$, YSZ, $SrTiO_3$, $BaTiO_3$, and $LaAlO_3$, for example.

This list may also contain materials surely available with a large diameter, generally, but not according to certain characteristics or specifications. Silicon, for example, is actually available today with a diameter of 300 mm, but it cannot be obtained at this diameter with an ingot growth technique of the molten zone type, which would only allow excessively low residual oxygen contents.

One or several small size substrates may be cut out into blocks 2.

The blocks 2 are then assembled to an intermediate substrate 1.

Finally, the block portions 7, as defined in the method described in U.S. Pat. No. 6,562,127 B1, are transferred on a final substrate 6. The final substrate 6 may have any size and shape.

Thus, it is possible to transfer block portions 7 of a given material onto a circular substrate with a size greater than 200 mm in diameter, or even greater than 300 mm in diameter, regardless of the size of the substrate from which are formed the blocks 2.

This technique is all the more interesting since, for reasons of costs, manufacturers of microelectronic, optronic, and photonic devices increasingly tend to manufacture the devices on substrates with a size greater than 200 mm in diameter, or even greater than 300 mm in diameter.

However, this method is not satisfactory.

Indeed, in order to ensure assembling of all the blocks 2 on one of the faces of the final substrate 6, it is necessary to proceed with a chemical-mechanical polishing step or a dual-face polishing step so as to make the free surfaces 4 of the blocks 2 coplanar.

Indeed, the blocks 2 generally have different thicknesses (the thickness of a block 2 being defined as the distance between its two parallel faces).

As illustrated in FIG. 1, the differences in the thicknesses of the blocks 2 assembled on an intermediate substrate 1 makes the assembling step of putting the free surface 4 of each of the blocks 2 in contact with the final substrate 6 impossible, and the thinner blocks 2 cannot adhere to the surface of the final substrate 6. Moreover, certain blocks 2 can only contact and adhere to the final substrate 6 on only a portion of their surface (e.g., the thickest portion). Any localized excessive thickness in the blocks 2 is problematic for this reason.

The planarization step, by chemical-mechanical polishing or dual-face polishing can overcome this problem.

The planarization step inevitably affects the yield of the transfer method.

Moreover, the planarization step may degrade the free surface 4 of the blocks 2.

Further, the planarization step may generate additional cost for the transfer method, and the increased cost may be high since the relevant material may be difficult to polish, like SiC, for example.

BRIEF SUMMARY

An object of the present disclosure is to overcome these limitations of the state of the art by providing a transfer method avoiding the use of a step for planarization of the blocks, or allowing simplification or lightening of the latter.

The disclosure relates to a transfer method comprising the following steps:

a. providing an intermediate substrate, the intermediate substrate comprising, on one of its faces, blocks assembled by a first main face to the intermediate substrate, the blocks having a free surface opposite to the first main face, and comprising a monocrystalline material, the blocks comprising an embrittlement area, the embrittlement area and the free surface of each block delimiting a block portion intended to be transferred onto a final substrate;

b. executing an assembling step by putting the free surface of each of the blocks in contact with the final substrate; and c. executing, after the assembling step, detachment at the embrittlement area of each of the blocks so as to transfer the block portion of each of the blocks onto the final substrate.

During the assembling step, the intermediate substrate is deformed so that the free surfaces of the blocks become coplanar.

According to an embodiment, the assembling step b is a molecular adhesion step.

According to an embodiment, an assembling layer is inserted between the final substrate and the blocks before the assembling step b.

According to an embodiment, the blocks have a thickness equal to the distance between the first main face and the free surface of the block, the thickness difference between the thinnest block and the thickest block is less than 50 μm, preferably less than 5 μm.

According to an embodiment, the embrittlement area of each of the blocks is formed by implantation of ionic species.

According to an embodiment, the detachment step c comprises a heat treatment.

According to an embodiment, the intermediate substrate comprises at least one material of the following materials: polymer, BCB, PDMS, polyimides, silicone resins, epoxy resins, elastomers, aluminum film, copper film, molybdenum film, tungsten film, nickel film, stainless steel film, glasses, polycrystalline materials, ceramic materials, sintered materials, oxides, aluminas, nitrides, silicates, or carbides.

According to an embodiment, the intermediate substrate comprises a mesh structure, a fabric structure, a foam structure, a porous structure, or a structure comprising a composite material.

According to an embodiment, the intermediate substrate is laminated and comprises at least one additional layer, which may be deformable.

According to an embodiment, the blocks comprise at least one of the following materials: SiC, GaN, GaAs, InP, GaSb, GaP, InAs, Ge, ZnO, LiTaO$_3$, LiNbO$_3$, diamond, sapphire, MgO, CeO$_2$, YSZ, SrTiO$_3$, BaTiO$_3$, LaAlO$_3$, or silicon.

According to an embodiment, the blocks comprise a first type of blocks and a second type of blocks having a chemical nature different than that of the first type of blocks.

According to an embodiment, the free surface of the blocks has a square, rectangular, circular or hexagonal shape.

According to an embodiment, the final substrate comprises at least one of the following materials: Si, Ge, GaAs, sapphire, alumina, glass, quartz, ceramics, plastic, metal, SiC, or AN.

The disclosure also relates to a stack comprising:

a first substrate comprising, on a main face, assembled blocks according to a first main face to the first substrate, the main face of the first substrate being planar when the first substrate is in the free condition, the blocks comprising a monocrystalline material, and having an embrittlement area, the stack comprises a second substrate assembled according to a second main face of the blocks opposite to the first main face of the blocks, the main face of the first substrate being deformed so that the second main faces of the blocks are coplanar.

As used herein, the term "free condition" means the condition of the first substrate before its assembling to the second substrate.

According to an embodiment, the second substrate is assembled to the second face of the blocks by molecular adhesion.

According to an embodiment, each of the blocks has a thickness equal to the distance between the first face and the second face of the block, and the thickness difference between the thinnest block and the thickest block is less than 50 μm, preferably less than 5 μm.

According to an embodiment, the blocks comprise an embrittlement area, the embrittlement area and the second face of each block delimiting a block portion intended to be transferred onto the second substrate, the embrittlement area of each of the blocks being formed by implantation of ionic species.

According to an embodiment, the blocks comprise at least one of the following materials: SiC, GaN, GaAs, InP, GaSb, GaP, InAs, Ge, ZnO, LiTaO$_3$, LiNbO$_3$, diamond, sapphire, MgO, CeO$_2$, YSZ, SrTiO$_3$, BaTiO$_3$, LaAlO$_3$, or silicon.

According to an embodiment, the final substrate comprises at least one of the following materials: Si, Ge, GaAs, sapphire, alumina, glass, quartz, ceramics, plastic, metal, SiC, or AN.

According to an embodiment, the first substrate comprises at least one of the following materials: polymer, BCB, PDMS, polyimides, silicone resins, epoxy resins, elastomers, aluminum film, copper film, molybdenum film, tungsten film, nickel film, stainless steel film, glasses, polycrystalline materials, ceramic materials, sintered materials, oxides, aluminas, nitrides, silicates, or carbides.

BRIEF DESCRIPTION OF THE DRAWINGS

The disclosure will be better understood in the light of the description that follows of particular and non-limiting embodiments of the disclosure with reference to the appended figures wherein.

DETAILED DESCRIPTION

For the different embodiments, the same references will be used for identical elements or ensuring the same function, for the sake of simplifying the description.

The transfer method according to the disclosure comprises a step a, which consists of providing an intermediate substrate 10.

As this will be subsequently explained in the description of the present disclosure, the intermediate substrate 10 is deformable.

Figure 1:
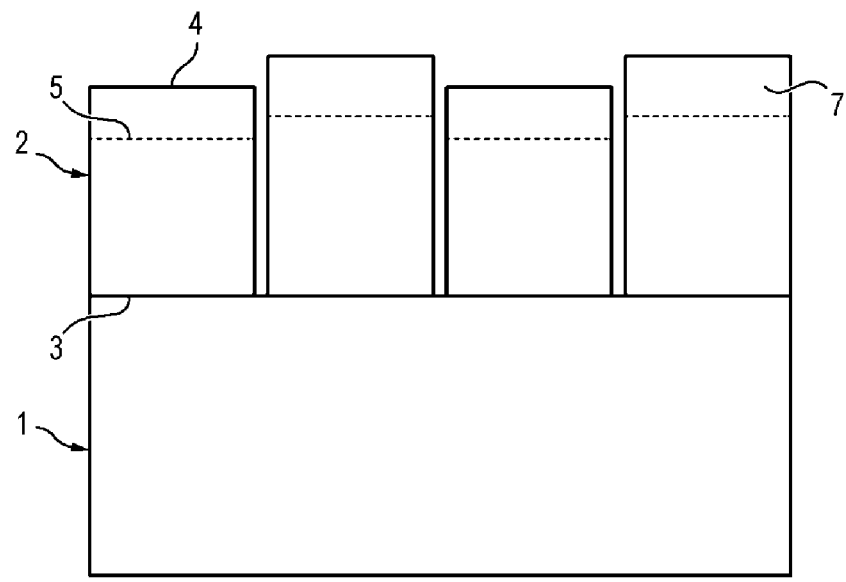
FIG. 1 is a view of the transfer method according to the prior art.
Figure 2:
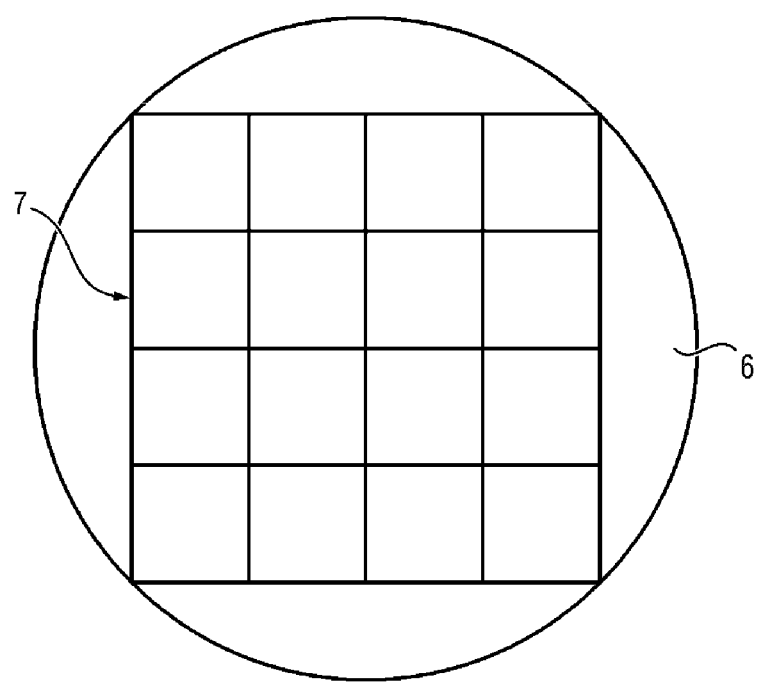
FIG. 2 is a top view of the final substrate comprising blocks obtained according to the prior art.
Figure 3:
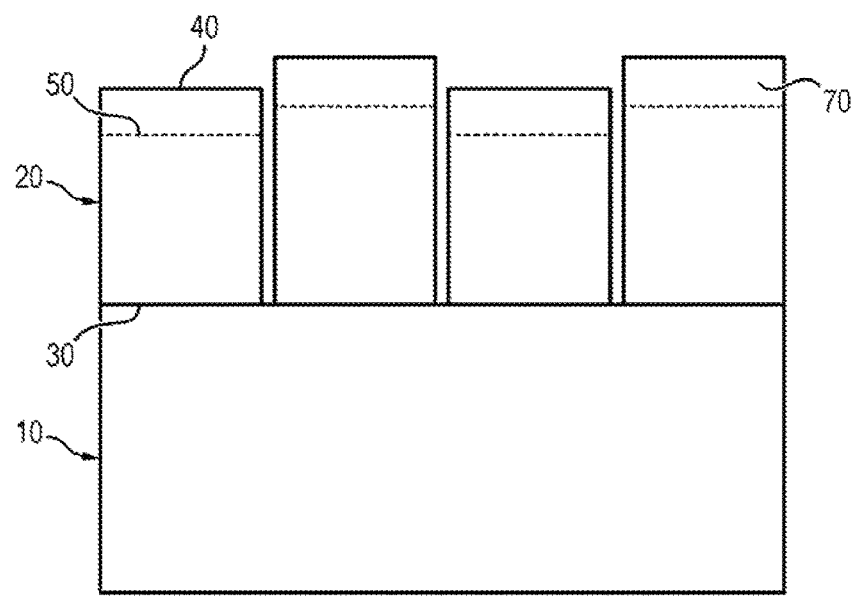
FIG. 3 is a schematic illustration of the transfer method according to the disclosure.
Figure 4:
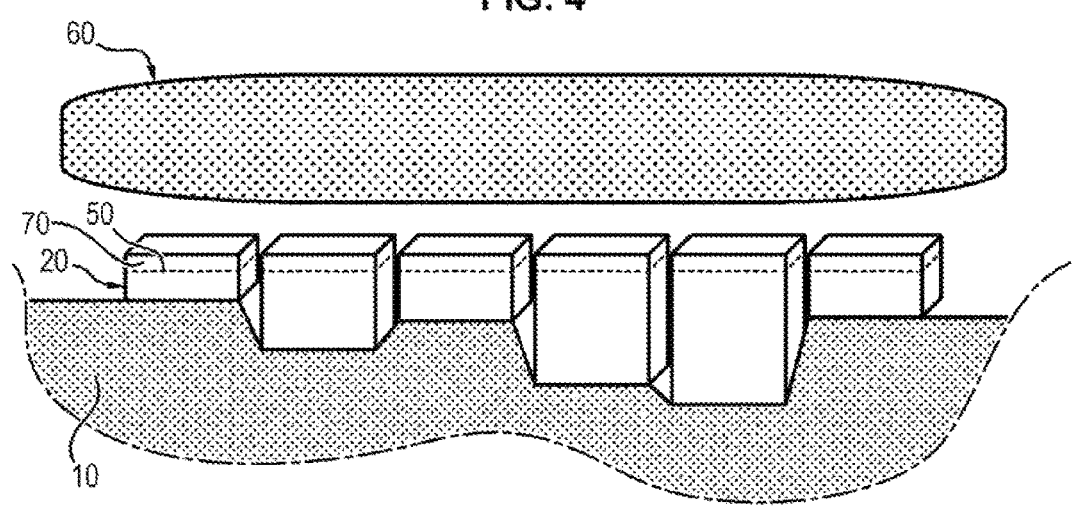
FIG. 4 is a schematic illustration of the method according to the disclosure.

The deformation may have the purpose of reducing the front face of the whole of the blocks 20 to the same average plane, or further of allowing slight pivoting of the blocks 20 (FIG. 4), or a combination thereof.

Nature of the Intermediate Substrate 10

The intermediate substrate 10 may be a substrate with any shape and dimensions. In particular, it may be circular and with a diameter greater than 100 millimeters, for example, 200 millimeters or even 300 millimeters. It may be square, or rectangular and have equivalent dimensions.

The intermediate substrate 10 comprises a first face, which is referred to as a "front face."

The intermediate substrate 10 may be a bulk substrate or laminated or further consisting of sub-elements having some mobility relative to each other.

Unlike the customary use in the field of techniques for assembling substrates and/or chips at a wafer level according to which the substrates are considered as non-deformable, the possibility of the intermediate support undergoing some deformation will be sought here.

The deformation may be an elastic and/or plastic deformation of one of the materials making up the intermediate support and/or may result from the movement of certain sub-assemblies of this intermediate support.

In the case when the intermediate support is a bulk substrate, the desired deformation may be elastic or plastic, or a combination thereof.

In the first case, the capability of the intermediate substrate 10 to be deformed elastically is quantified by its Young's modulus. An elastic deformation of the intermediate substrate 10 is reversible, so that when a stress exerted on the intermediate substrate 10 is released, the intermediate substrate 10 recovers its initial shape.

On the contrary, a plastic deformation of the intermediate substrate 10 is not reversible. But the support may generally be again deformed by new plastic or elastic deformation or a combination thereof.

Although it should meet rather tight requirements like, for example, being compatible with the temperature required for the detachment step c, a wide range of materials is possible for selecting the nature of the material making up the intermediate support.

When the required temperature of use is not very high, typically less than 150° C. to 200° C., the material may be a polymer. For example, the material may be any of the following polymers: BCB (Benzocyclobutene), PDMS (Polydimethylsiloxane), polyimides, silicone resins, epoxy resins, elastomers, etc. These substrates may be obtained by various conventional production techniques, for example, by molding, casting, or screen printing, for typical thicknesses comprised between 30 µm and 500 µm.

The retained material may also be a metal film, for example, an aluminum, copper, molybdenum, tungsten, nickel, or stainless steel film. Some of these films are also known under the name of paper, for example, "aluminum foil"). The thickness of these films will typically be comprised between 20 µm and 80 µm.

For operations requiring high temperatures, beyond 200° C., inorganic amorphous materials such as glasses and/or polycrystalline materials, either sintered or not, whether these are oxides, aluminas, nitrides, silicates, carbides and, more generally, ceramic materials may be preferred. In these cases, thicknesses limited to below 150 µm, or even 80 will be preferred.

The deformability of the supporting substrates may also be obtained by some texturization of the material of interest. For example, the deformable substrate may comprise a ventilated structure. This may, for example, be a mesh structure formed with wires of the material of interest, inter alia, characterized by a wire diameter and an inter-wire distance. The diameter of the wires is typically between 30 µm and 300 µm, while the inter-wire distance is typically between 50 µm and 1 mm. The intermediate support may have a total thickness of from 40 µm to 150 µm.

For example, aluminum, nickel, copper, molybdenum, or further stainless steel meshes may be selected, without, however, being limited to metal wires. Several techniques for making these meshes may be contemplated: molding, rolling, welding, weaving, etc.

For example, it may also be possible to shift toward papers or fabrics made from ceramic fibers such as alumina or based on other refractory materials.

Equivalent systems exist, characterized by more disordered organizations than a regular mesh. For example, structures known as "metal foam" structures (e.g., aluminum foam, copper foam, nickel foam, etc.) may also be used as the supporting substrate. A ventilated structure may also correspond to a porous material. The porosity may be obtained as soon as the intermediate substrate 10 is formed by the method for manufacturing intermediate substrate 10, or by subsequent treatment such as electrochemical etching. The nature of the porous material may vary. For example, the porous material may be a metal, such as porous nickel. As another example, the porous material may also be a semiconductor such as porous silicon.

Beyond a homogeneous material, either structured or not, the material making up the substrate may be a composite material or a heterogeneous material. As an example, the composition of the substrate may be obtained by distributing particles of a first material in a matrix of a second material. The first material may appear in several forms, such as, for example, nanoparticles, $SiO_2$ or other materials.

As an additional example, the intermediate substrate 10 may have a framework embedded in a matrix. For example, the aforementioned metal meshes or foams may be impregnated with a second material, such as a polymer or a ceramic.

The intermediate substrate 10 may also be laminated. By "laminated substrate" is meant an intermediate substrate 10 comprising a stack of a supporting substrate and of an additional layer.

In the case of a laminated substrate, the front face of the intermediate substrate 10 is the face formed by the free surface of the additional layer.

Still, in the case of a laminated substrate, the deformation is not mandatorily applied to the whole of the structure but may be preferentially localized in one or several additional layers.

For example, the intermediate support may consist of an additional 70 µm layer of PDMS providing some deformability, a layer of PDMS deposited on a silicon support with a thickness of 725 µm, comparatively much more rigid. PDMS may be replaced with other materials such as elastomers or other polymers, for example, BCB.

The deformation of the intermediate substrate 10 may be a deformation obtained not only by deformation of a material element, but may be allowed by releasing the relative movement of certain sub-assemblies of this intermediate substrate 10. In order to take up again the example of laminated substrates, cavities may be made and locally positioned at the relevant locations under the additional layer, making its deformation easier. The cavities may be sealed or not, and contain air or a gas at a controlled pressure. The recessed cavities may also be filled with a material deformable by nature like a polymer, or by structure-like foam. The freedom of movement may also become a forced movement under the control of certain actuators and micromotors. Such intermediate supports may be advantageously manufactured with technologies derived from MEMS micro-technologies.

Stress Causing Deformation of the Intermediate Substrate 10

The deformation may be caused from several types of stresses. For the cases when the assembling is accomplished successively by propagation of an adhesive bonding wave, like in the case of bonding by molecular adhesion, a deformation may be obtained by the natural closer movement of the parts, which are successively entered in the assembling process. The deformation may also be caused by gravity, for example, under its own weight of the blocks 20 and/or of the intermediate substrate 10, which, in this case, will be advantageously placed above the final substrate 60. The deformation may also be caused by other external, global or localized forces. An operator may thus vertically press each of the blocks 20, either successively or simultaneously. Passing a tool of the roller type may have this effect. This operation may also be performed automatically by a machine. It is also possible to resort to pressurization, for example, with compressed air, a pressure that will be conveniently adjusted according to the surfaces to be assembled and to the assembling method. The stress may also result from attraction phenomena between the blocks 20 and the receiving surface of the final substrate 60. For example, in the case of anodic bonding, electrostatic attraction forces may be used.

Nature of the Blocks 20

Still according to step a. of the present disclosure, blocks 20 are assembled by a first main face 30 on the front face of the intermediate substrate 10.

The blocks 20 comprise a free surface 40 opposite to the first main face 30.

In the case of an intermediate substrate 10 as a laminated substrate, the blocks 20 are, therefore, positioned on the free surface of the additional layer.

The free surface 40 of the blocks 20 may be of a square, rectangular, hexagonal, polygonal or circular shape.

The free surface 40 of a block 20 of a circular shape may have a diameter comprised between a few fractions of a mm and a few tens of mm.

The free surface 40 of a block 20 of a square shape may have a side comprised between a few fractions of a mm and a few hundred mm.

The free surface 40 of a block 20 of a rectangular shape may have a length comprised between a few fractions of a mm and a few hundred mm (for example, between 0.5 mm and 5 mm, or even between 0.5 mm and 10 mm), and a width comprised between a few fractions of a mm and a few hundred mm (for example, between 0.5 mm and 5 mm, or even between 0.5 mm and 10 mm), with extreme form factors close to those of a square or, on the contrary, very elongated rectangles, for example, 5 mm×200 mm.

The blocks 20 may be regularly positioned on the intermediate substrate 10 in order to form a grid or an array. The distribution of the blocks 20 may follow other periodic organizations, for example, as a staggered distribution. In the case of hexagonal blocks 20, a compact hexagonal distribution will allow optimization of the covered surface.

The distance between two adjacent blocks 20 may optionally vary from zero to a few mms (for example, between 0.1 mm and 1 mm, or even between 0.1 mm and 2 mm). By selecting for this distance, large values, in the range of one mm, may actually contribute to accommodating the required deformation of the intermediate support during the assembling step b.

The blocks 20 may comprise at least one of the following materials: SiC, GaN, GaAs, InP, GaSb, GaP, InAs, Ge, ZnO, $LiTaO_3$, $LiNbO_3$, diamond, sapphire, MgO, $CeO_2$, YSZ, $SrTiO_3$, $BaTiO_3$, $LaAlO_3$, and silicon.

If the blocks 20 stem from the same manufacturing batch or from similar batches, the thickness difference between the thinnest block 20 and the thickest block 20 is typically less than 50 μm, or even less than 2 μm. The assembling technique of these blocks 20 on the intermediate support may add equivalent variability as to the positioning of the front face of the blocks 20. All in all, the positioning differences to be compensated during the assembling step b are, therefore, typically comprised between 0 and 50 μm. The deformation of the intermediate support should allow compensation of these values.

In a particular embodiment, all the blocks 20 are of identical nature.

In other embodiments, blocks 20 of different natures will be combined, for example, one block 20 out of two in GaAs and the other one in InP. In this case, the respective surface of the blocks 20 may be different, for example, 1 mm×10 mm for InP blocks 20 and 9 mm×10 mm for GaAs blocks 20. Also in this case, the respective rated thicknesses may be different, with thicknesses that may, for example, be 625 μm for InP blocks 20 and 575 μm for GaAs blocks. In this case, the average value of the thickness differences to be compensated is 50 μm. Instead of using a material removal step for recovering this deviation, the present disclosure is based on an equivalent deformation of the intermediate substrate 10.

By "block 20 of different nature," should also be meant cases when this is the same material but with at least one different property, for example, crystal orientation, doping, oxygen content, or alloy content; for example, Si blocks 20 with a low oxygen content combined with Si blocks 20 with a low oxygen content, or further SiGe blocks 20 with a 20% Ge content combined with SiGe blocks 20 with a Ge content of 40%. As they then stem from ingots and/or different sources, or having different characteristics, it may indeed be expected in this case that this difference is passed on with a thickness difference of the initial blocks 20.

Moreover, in the case of blocks 20 of different nature, all the blocks 20 do not have the same polishing rate during a mechano-chemical polishing step as described in the prior art U.S. Pat. No. 6,562,127 B1.

Adhesion of the Blocks 20 on the Intermediate Support

The blocks 20 may be maintained on the intermediate substrate 10 by molecular adhesion.

One or several adhesive bonding layers may be formed in order to facilitate molecular adhesion. Such a layer may be obtained by deposition. It may be deposited on the blocks 20 and/or on the intermediate substrate 10 before the molecular adhesion step. This layer may, for example, be an $SiO_2$ layer. Slight annealing for smoothing or further mechano-chemical polishing may be achieved after the deposition step, less with the purpose of catching up a level difference than for improving a surface condition that the deposition would have been able to degrade.

The molecular adhesion of the blocks 20 on the intermediate substrate 10 may also be reinforced by thermal annealing after assembly.

For example, square monocrystalline GaN blocks 20 with a side of 5 cm are positioned on an intermediate substrate 10 in molybdenum, the latter appearing as a metal film with a thickness of 25 μm. Nine GaN substrates are assembled on this film in a square configuration, three vertically by three horizontally. The distance between two adjacent squares is 2 mm, leading to a total surface area of molybdenum of about 20×20 cm$^2$.

Initially, each of the surfaces to be put into contact is covered by depositing a $SiO_2$ layer with a thickness of 150 nm. After putting them in contact and applying a slight stress accompanying a rolling movement, the assembly is heated to a temperature comprised between 800° C. and 1200° C., for a period comprised between 5 minutes and 2 hours.

The blocks 20 may also be maintained on the intermediate substrate 10 via an adhesive material. This adhesive material may notably be in the less demanding cases in terms of treatment temperature during the detachment step c, a relatively standard adhesive. It is then possible to select them from polymer adhesives, epoxy resins, acrylic resins, silicone resins, or polyimides. Notably, for less tolerant temperatures, this adhesive material may also be selected from other adhesive families, such as cements or further ceramic adhesives based on alumina or silica or aluminum nitride or zirconia or magnesium oxide or silicon carbide, for example.

According to an example, square blocks 20 of monocrystalline YSZ of 2×2 cm$^2$ are assembled on an intermediate substrate 10, which appears as a flexible nickel mesh with a thickness of 60 μm. The assembling is achieved by means of a ceramic adhesive based on alumina, which further has the advantage of impregnating the support as a mesh. The whole is then annealed, for example, between 250° C. and 600° C. for at least 2 hours.

Instead of resorting to an assembling of the blocks 20 with an already formed intermediate substrate 10, it is also possible to form the intermediate substrate 10 by depositing or molding the latter on the whole of the blocks 20, which will have been pre-positioned.

According to an example, the question is to assemble monocrystalline InP hexagonal blocks 20 with a defined dimension so that each hexagon is included in a circle with a diameter of 50 mm. The hexagons are pre-positioned on a planar support in order to form a compact hexagonal lattice, a distance of 1 mm separating the edges of each of the blocks 20. On these blocks 20, an intermediate support in PDMS with a thickness of 80 μm is then formed by molding.

Assembling Step b

The method according to the disclosure comprises a step b for assembling the free surface 40 of the blocks 20 with a final substrate 60.

According to the state of the art, the blocks 20 do not all have the same thickness. The thickness of a block 20 is defined as the distance between the first main face 30 and the free surface 40 of block 20.

Thus, during the assembling step, the intermediate substrate 10 deforms so that the free surfaces of the blocks 20 become coplanar. The deformation of the intermediate substrate 10 enters into play as described in the section "Stress causing deformation."

Therefore, all the free surfaces of the blocks 20 present on an intermediate substrate 10 are in contact with the final substrate 60 at the end of the assembling step.

The assembling step b is carried out in a similar way to the one that is used within the scope of adhesively bonding continuous substrates (not as blocks) for the transfer of layers.

In particular, it may comprise a molecular adhesion step. One or several adhesive bonding layers may be formed in order to facilitate molecular adhesion. Such a layer may be obtained by thermal deposition or oxidation or any other equivalent treatment. It may be deposited on the blocks 20 covering the intermediate support and/or on the final support before the molecular adhesion step. This layer may, for example, be an $SiO_2$ layer. Slight annealing for smoothing or further mechano-chemical polishing may be achieved after the deposition step. Molecular adhesion of the blocks 20 on the intermediate substrate 10 may also be reinforced by thermal annealing after assembling.

Before the assembling step b, the method according to the disclosure may comprise the formation of an assembling layer on the free surface 40 of the blocks 20 and/or on one face of the final substrate 60.

Thus, the assembling layer is found inserted between the final substrate 60 and the free surface 40 of the blocks 20 at the end of the assembling step b.

The assembling layer may comprise a polymer adhesive or a cement.

The assembling step b may also be any other equivalent technique known to one skilled in the art: anodic bonding, eutectic bonding, adhesive bonding, etc. Reference may, for example, be made to the textbook "Wafer bonding: applications and technology," M. Alexe, U. Gösele (Eds.), Springer series in materials science, ISSN 0933-033X; 75.

Detachment Step c.

According to step a, the blocks 20 each comprise an embrittlement area 50.

The embrittlement area 50 of each of the blocks 20 is essentially parallel to the free surface 40 of blocks 20.

For each block 20, the embrittlement area 50 and the free surface 40 delimits a block portion 70 intended to be transferred onto a final substrate 60.

The embrittlement area 50 may be formed by implantation of ionic species. For example, the ionic species may comprise at least one of the species selected from among: hydrogen, helium, and noble gases.

In this respect, one skilled in the art may refer to U.S. Pat. No. 5,374,564.

The embrittlement may also be obtained by other means. For example, this may be a porous buried layer. For example, in the case of silicon, monocrystalline silicon may be made so as to be locally porous by electrochemical anodization in an HF-Ethanol bath. In this respect, one skilled in the art may refer to U.S. Pat. No. 5,854,123.

The embrittlement may also correspond to a change in composition inside a buried layer or further at an interface between two different materials, notably if one of them is stressed because of the difference of its crystalline lattice parameter relative to its growth substrate. For example, this may be the case upon making Si/SiGe stacks by epitaxy.

The embrittlement may also be caused subsequent to laser irradiation causing a faulty area in depth.

The detachment, substantially along the embrittled area, may generally be caused by ripening the embrittlement area 50, for example, by means of annealing. It may also be subsequent to the application of an external mechanical stress, like a shearing force, a peeling, a traction force, etc. This stress may also partly result from differences in thermal expansion of the materials set into play. The detachment may also result from the use of chemical sub-etching (often called "lift-off"), giving the possibility of selectively etching a buried layer or corroding a buried interface.

Final Substrate 60

The selection of the final substrate 60 is performed in a similar way to the one achieved within the scope of adhesive bonding of non-paved substrates for the transfer of layers. This selection is, for a major part, guided by the conditions of use of the latter and by the final application.

Depending on the cases, the final substrate 60 may either be rigid or not, of any shape and dimensions, either organic or not, and may be monocrystalline, polycrystalline, or amorphous. It may comprise at least one of the following materials: Si, Ge, GaAs, sapphire, alumina, glass, quartz, ceramics, plastic, metal, SiC, and AlN.

Product

Thus, subsequent to the assembling step b, a stack is obtained comprising:

a first substrate comprising, on a main face, assembled blocks 20 according to a first main face 30 to the first substrate, the main face of the first substrate being planar when the first substrate is in the free condition, the blocks 20 being in a monocrystalline material, and comprising an embrittlement area 50.

The stack also comprises a second substrate assembled according to a second main face of the blocks 20 opposite to the first main face 30 of the blocks, the main face of the first substrate being deformed so that the second main faces of the blocks 20 are coplanar.

The second substrate may be assembled to the second face of the blocks 20 by molecular adhesion.

The blocks 20 may have a thickness equal to the distance between the first face and the second face of block 20, the thickness difference between the thinnest block 20 and the thickest block 20 is less than 50 μm, preferably less than 5 μm.

The blocks 20 may comprise an embrittlement area 50, the embrittlement area 50 and the second face of each block 20 delimiting a block portion 70 intended to be transferred onto the second substrate, the embrittlement area 50 of each of the blocks 20 being formed by implantation of ionic species.

The blocks 20 may comprise at least one of the following materials: SiC, GaN, GaAs, InP, GaSb, GaP, InAs, Ge, ZnO, LiTaO$_3$, LiNbO$_3$, diamond, sapphire, MgO, CeO$_2$, YSZ, SrTiO$_3$, BaTiO$_3$, LaAlO$_3$, and silicon.

The final substrate 60 may comprise at least one of the following materials: Si, Ge, GaAs, sapphire, alumina, glass, quartz, ceramics, plastic, metal, SiC, and AlN.

The first substrate may comprise at least one of the following materials: polymer, BCB, PDMS, polyimides, silicone resins, epoxy resins, elastomers, aluminium film, copper film, molybdenum film, tungsten film, nickel film, stainless steel film, glasses, polycrystalline materials, ceramic materials, sintered materials, oxides, aluminas, nitrides, silicates, and carbides.

REFERENCES

U.S. Pat. No. 6,562,127.
Wafer bonding: applications and technology, M. Alexe, U. Gösele (Eds.), Springer series in materials science, ISSN 0933-033X; 75.
U.S. Pat. No. 5,374,564.
U.S. Pat. No. 5,854,123.

The invention claimed is:

1. A transfer method comprising the steps:
   a. providing a deformable intermediate substrate, the deformable intermediate substrate comprising, on one of its faces, blocks assembled by a first main face to the deformable intermediate substrate, the blocks having a free surface opposite to the first main face, and comprising monocrystalline material, the blocks comprising an embrittlement area, the embrittlement area and the free surface of each block, delimiting a block portion intended to be transferred onto a final substrate;
   b. executing an assembling step comprising the bonding of the deformable intermediate substrate with the final substrate by putting the free surface of the blocks of the deformable intermediate substrate in contact with the final substrate, wherein said deformable intermediate substrate deforms so that the free surface of each of the blocks becomes coplanar and contacts the final substrate at the end of the bonding step;
   c. executing, after the assembling step, a detachment at the embrittlement area of each of the blocks so as to transfer the block portion of each of the blocks onto the final substrate.

2. The transfer method according to claim 1, wherein the assembling step b. is a molecular adhesion step.

3. The transfer method according to claim 1, wherein an assembling layer is inserted between the final substrate and the blocks before the assembling step b.

4. The transfer method according to claim 1, wherein the blocks have a thickness equal to the distance between the first main face and the free surface of the block, the thickness difference between the thinnest block and the thickest block is less than 50 μm.

5. The transfer method according to claim 1, wherein the embrittlement area of each of the blocks is formed by implantation of ionic species.

6. The transfer method according to claim 5, wherein the detachment step c. comprises a heat treatment.

7. The transfer method according to claim 1, wherein the deformable intermediate substrate comprises at least one material selected from the group consisting of: polymer, BCB, PDMS, polyimides, silicone resins, epoxy resins, elastomers, aluminum film, copper film, molybdenum film, tungsten film, nickel film, stainless steel film, glasses, polycrystalline materials, ceramic materials, sintered materials, oxides, aluminas, nitrides, silicates, and carbides.

8. The transfer method according to claim 1, wherein the deformable intermediate substrate comprises a structure selected from the group consisting of: a mesh structure, a fabric structure, a foam structure, a porous structure, and a structure of composite material.

9. The transfer method according to claim 1, wherein the deformable intermediate substrate is laminated and comprises at least one additional layer, the additional layer being deformable.

10. The transfer method according to claim 1, wherein the blocks comprise at least one material selected from the group consisting of: SiC, GaN, GaAs, InP, GaSb, GaP, InAs, Ge, ZnO, LiTaO$_3$, LiNbO$_3$, diamond, sapphire, MgO, CeO$_2$, YSZ, SrTiO$_3$, BaTiO$_3$, LaAlO$_3$, and silicon.

11. The transfer method according to claim 1, wherein the blocks comprise a first set of blocks and a second set of blocks, the second set of blocks having a different chemical nature than that of the first set of blocks.

12. The transfer method according to claim 1, wherein the free surface of the blocks has a square, rectangular, circular or hexagonal shape.

13. The transfer method according to claim 1, wherein the final substrate comprises at least one material selected from the group consisting of: Si, Ge, GaAs, sapphire, alumina, glass, quartz, ceramics, plastic, metal, SiC, and AlN.

14. A stack comprising:
   a first substrate comprising, on a main face, blocks assembled to a first main face to the first substrate, the main face of the first substrate being planar when the first substrate is in a free condition, the blocks comprising a monocrystalline material, and comprising an embrittlement area; and
   a second substrate assembled to a second main face of the blocks opposite to the first main face of the blocks, the main face of the first substrate being deformed so that the second main faces of the blocks are coplanar.

15. The stack according to claim 14, wherein the second substrate is assembled to the second main face of the blocks by molecular adhesion.

16. The stack according to claim 14, wherein the blocks have a thickness equal to the distance between the first main face and the second main face of the block, the thickness difference between the thinnest block and the thickest block is less than 50 µm.

17. The stack according to claim 14, wherein the blocks comprise an embrittlement area, the embrittlement area and the second main face of each block delimiting a block portion intended to be transferred onto the second substrate, the embrittlement area of each of the blocks being formed by implantation of ionic species.

18. The stack according to claim 14, wherein the blocks comprise at least one material selected from the group consisting of: SiC, GaN, GaAs, InP, GaSb, GaP, InAs, Ge, ZnO, $LiTaO_3$, $LiNbO_3$, diamond, sapphire, MgO, $CeO_2$, YSZ, $SrTiO_3$, $BaTiO_3$, $LaAlO_3$, and silicon.

19. The stack according to claim 14, wherein the final substrate comprises at least one material selected from the group consisting of: Si, Ge, GaAs, sapphire, alumina, glass, quartz, ceramics, plastic, metal, SiC, and AlN.

20. The stack according to claim 14, wherein the first substrate comprises at least one material selected from the group consisting of: polymer, BCB, PDMS, polyimides, silicone resins, epoxy resins, elastomers, aluminum film, copper film, molybdenum film, tungsten film, nickel film, stainless steel film, glasses, polycrystalline materials, ceramic materials, sintered materials, oxides, aluminas, nitrides, silicates, and carbides.

* * * * *

UNITED STATES PATENT AND TRADEMARK OFFICE
CERTIFICATE OF CORRECTION

PATENT NO. : 10,453,739 B2
APPLICATION NO. : 15/759457
DATED : October 22, 2019
INVENTOR(S) : Bruno Ghyselen It is certified that error appears in the above-identified patent and that said Letters Patent is hereby corrected as shown below:

In the Specification

Column 3, Line 67, change "SiC, or AN." to --SiC, or AlN.--
Column 4, Line 39, change "SiC, or AN." to --SiC, or AlN.--
Column 6, Line 2, change "even 80 will" to --even 80 µm, will--

Signed and Sealed this
Twenty-fourth Day of December, 2019

Andrei Iancu
*Director of the United States Patent and Trademark Office*